United States Patent
Melcher et al.

(10) Patent No.: US 7,936,610 B1
(45) Date of Patent: May 3, 2011

(54) SELECTIVE REFRESH OF SINGLE BIT MEMORY CELLS

(75) Inventors: Robert Melcher, Folsom, CA (US);
Sean Eilert, Penryn, CA (US); John Egler, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 12/534,792

(22) Filed: Aug. 3, 2009

(51) Int. Cl.
*G11C 16/06* (2006.01)

(52) U.S. Cl. ........... 365/185.25; 364/185.03; 364/185.2; 364/185.21

(58) Field of Classification Search ............. 365/185.03, 365/185.2, 185.21, 185.25
See application file for complete search history.

(56) References Cited

U.S. PATENT DOCUMENTS

| | | |
|---|---|---|
| 6,396,744 B1 | 5/2002 | Wong |
| 6,522,586 B2 | 2/2003 | Wong |
| 6,662,263 B1 | 12/2003 | Wong |
| 6,731,557 B2 | 5/2004 | Beretta |
| 7,079,422 B1 | 7/2006 | Wong |
| 7,224,604 B2 | 5/2007 | Lasser |
| 2009/0113115 A1* | 4/2009 | Nazarian et al. .............. 711/103 |
| 2009/0273969 A1* | 11/2009 | Taylor et al. .................. 365/163 |

* cited by examiner

*Primary Examiner* — Hoai V Ho
(74) *Attorney, Agent, or Firm* — Blakely, Sokoloff, Taylor & Zafman LLP

(57) ABSTRACT

Methods and systems to selectively refresh a single bit per cell non-volatile memory cell to reduce memory cell errors. In an embodiment, a memory device scans its memory cells, performing a multi-level read on memory cells in a single bit per cell mode. Depending on the state sensed, the cell is refreshed to a correct state if necessary. In one embodiment, the memory scan is appended to a user erase operation, a flash block is swapped with another bock if the state sensed indicates charge gain, and a flash cell is programmed up if the state sensed indicates charge loss.

20 Claims, 11 Drawing Sheets

US 7,936,610 B1

SELECTIVE REFRESH OF SINGLE BIT MEMORY CELLS

TECHNICAL FIELD

Embodiments of the invention are in the field of memory devices, and more specifically pertain to refresh of single bit per cell memory devices.

BACKGROUND

A flash EEPROM memory cell (NAND or NOR), as well as many other types of memory cells known in the art, may be configured in alternate modes of operation where the cell is to either store multiple bits per cell (multi-level) or store a single bit per cell. Such a memory cell when configured to store a single bit is typically referred to as operating in a pseudo single bit cell (PSBC) mode or simply as SBC mode. While the multi-bit mode provides much higher bit density, with greater numbers of bits per cell, there is a relatively greater possibility of read errors than for the single bit per cell mode. This heightened potential for read errors arises from the small differential voltages used to store adjacent states. For example, charge coupling between memory cells of an array becomes a greater problem.

Media management techniques have been employed by multi-level cell memories to reduce the error rates while still providing high storage density, but such techniques generally come at the expense of user functionality (typically in the form of programming restrictions). The SBC mode may therefore be offered to provide enhanced user functionality at the expense of bit density so that portions of a memory array may be operated in either SBC or multi-bit mode to arrive at a combination of bit density and functionality suitable to a variety of user/host device applications.

As memory cell sizes decrease, data failure rates in the SBC mode increase. Yet, to maintain greater user functionality in SBC mode than does the multi-bit mode, the user restrictions which improved error rates in the multi-bit mode cannot merely be applied to the SBC mode. Furthermore, a reduction in error rates in the SBC mode should also not come at the expense of a greatly increased memory device size or unnecessarily increase memory device wear.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

Figure 1A:
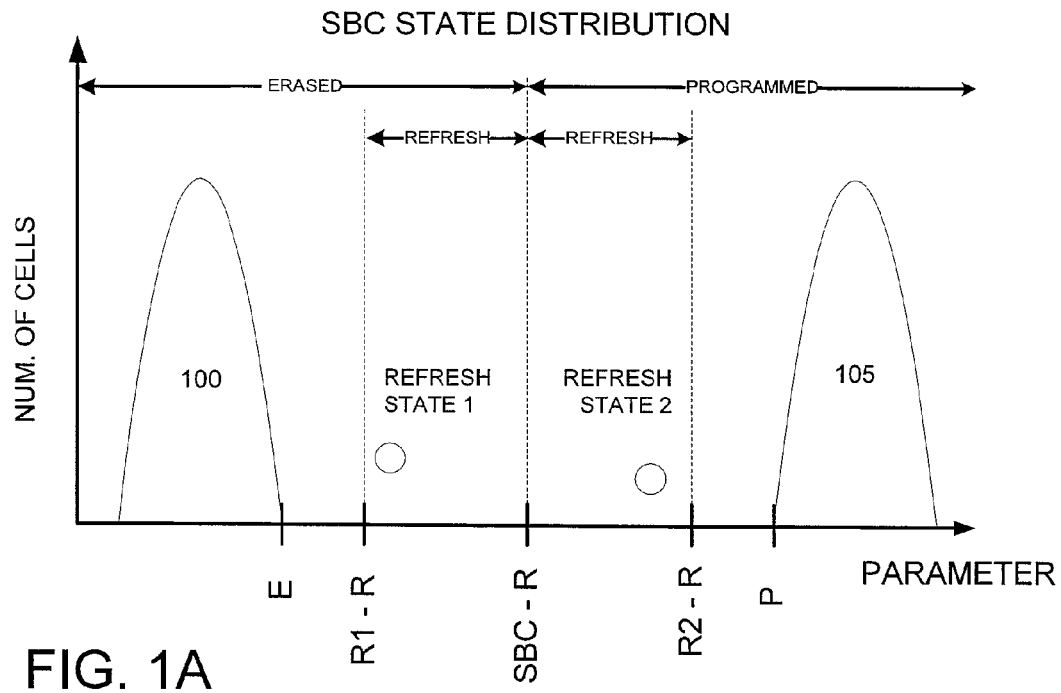
FIG. 1A illustrates a distribution of states for a population of memory cells operating in SBC mode.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Methods and systems to selectively refresh a non-volatile memory cell to reduce memory cell errors are described herein. FIG. 1A illustrates a distribution of states for a population of memory cells operating in SBC mode. As depicted, the population of memory cells predominantly consists of cells in either a first or second memory state (single bit per cell storage). For example, FIG. 1A depicts an erased memory state 100 and a programmed memory state 105. Determination of whether a given cell is at the erased memory state 100 or programmed memory state 105 is typically based on a SBC specific read reference parameter, denoted as "SBC-R" in FIG. 1A, capable of discriminating between the two memory storage states. In embodiments of the present invention however, a non-volatile memory device employs refresh reference parameter levels in addition to the SBC-R read reference to distinguish refresh states within the programmed/erased memory states. As further described elsewhere herein, cells of the memory device may then be scanned in search of those in refresh states and a selective refresh performed to remedy an identified refresh state. A global refresh of every cell, performed periodically for example, may therefore be avoided and because the refresh embodiments described herein correct potentially failing cells, any ECC overhead and user/host programming restrictions may also be avoided. Furthermore, because the memory device already provides multi-level sensing/read capability in support of MLC operation, the selective refresh method described herein requires little additional chip area to implement.

As depicted in FIG. 1A, to further define a first "REFRESH" state, a reference parameter "R1-R" is set to a parameter value between the "SBC-R" parameter value and the "E" (erased) parameter value corresponding to a value just greater than the vast majority of the memory cells in the erased state population 100. Similarly, to further define a second "REFRESH" state, a reference parameter "R2-R" is set to a parameter value between the "SBC-R" parameter value and the "P" (programmed) parameter value corresponding to a value just below the vast majority of the memory cells in the programmed population 105. It should be noted that even when a cell is in either the REFRESH state, the SBC-R reference may still properly identify the cell as either programmed or erased and therefore a "failing" cell as identified by the REFRESH states does not necessarily mean the cell will generate a read error. Rather, a "failing" cell as identified by the REFRESH states is merely statistically distinguishable from their nearest population distribution (erased or programmed).

Generally, the parameter utilized to discriminate refresh states from erased/programmed memory states is dependent on the memory cell technology. For example, phase change memories (PCM) may have such states parameterized by a resistance value while charge trapping memories, such as flash, may be parameterized by transistor threshold voltage levels, as further depicted in FIG. 1B. As shown, a charge gain reference voltage level CG-R is set to a voltage level below the SBC specific reference voltage level SBC-R while a charge loss reference voltage level CL-R is set to a voltage level above SBC-R. As long as this relative relationship is maintained, the actual voltages of CG-R, SBC-R and CL-R are a matter of technology generation and design choice. A cell sensed to have a threshold voltage below the CG-R reference voltage (e.g., a sensing circuit trips at a word line voltage equal to the CG-R voltage) is deemed to be at level 0, or a correct erased state. A cell sensed to have a threshold voltage at the next highest level, level 1 (e.g., a sensing circuit fails to trip at CG-R voltage but trips when a word line voltage increments up to SBC-R voltage) is deemed to be in a charge gain refresh state, but is nonetheless still readable as "erased." Similarly, a cell sensed to have a threshold voltage in level 2 (e.g., a sensing circuit fails to trip at SBC-R voltage but trips when a word line voltage increments up to CL-R voltage) is deemed to be in a charge loss refresh state, but is nonetheless still readable as "programmed." A cell sensed to have a threshold voltage in level 3 (e.g., a sensing circuit fails to trip at any of CG-R, SBC-R and CL-R) is deemed to be in a correct programmed state. As further described elsewhere herein, depending on whether a particular cell is determined to be at level 0, 1, 2 or 3, a corrective refresh operation may be performed and depending on whether a particular cell is at level 1 or level 2 (the refresh states), the corrective refresh may take the form of either a program operation or an erase operation.

Figure 1B:
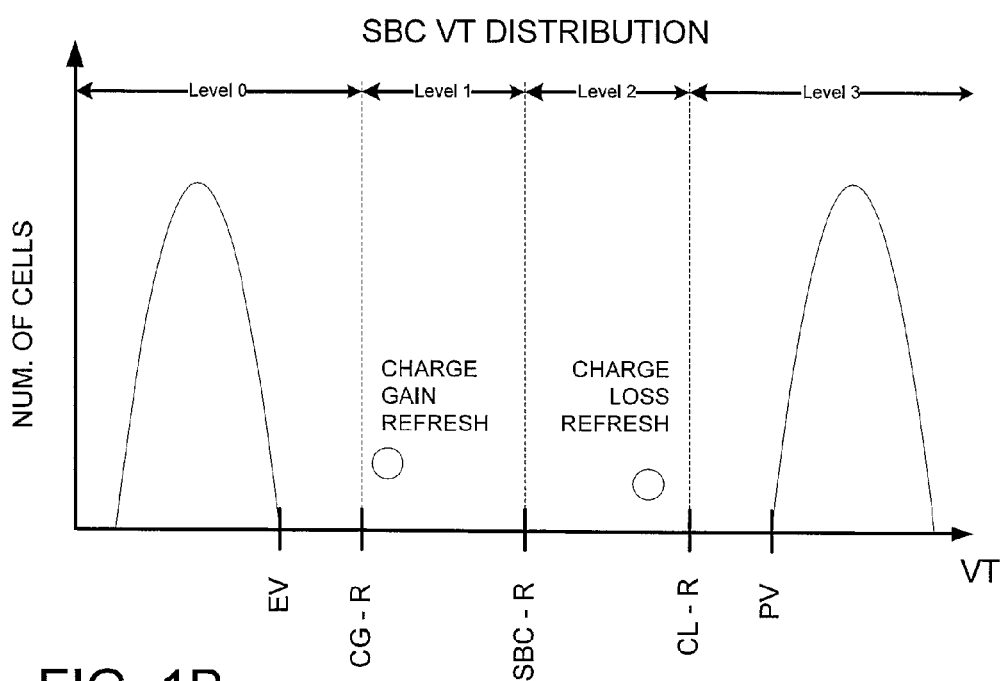
FIG. 1B illustrates a distribution of threshold voltages for a population of flash memory cells operating in SBC mode, in accordance with an embodiment of the present invention.

While a refresh method and apparatus utilizing the principles described with reference to FIG. 1B are now describe in particular detail in the context of a flash memory embodiment. One of ordinary skill in the art will appreciate that such a refresh method and apparatus may be readily applied either a NAND flash technology or a NOR flash technology as well as to other non-volatile memory technologies, such as PCM, MRAM, FRAM, etc. based on the more general principle illustrated in FIG. 1A.

Figure 2:
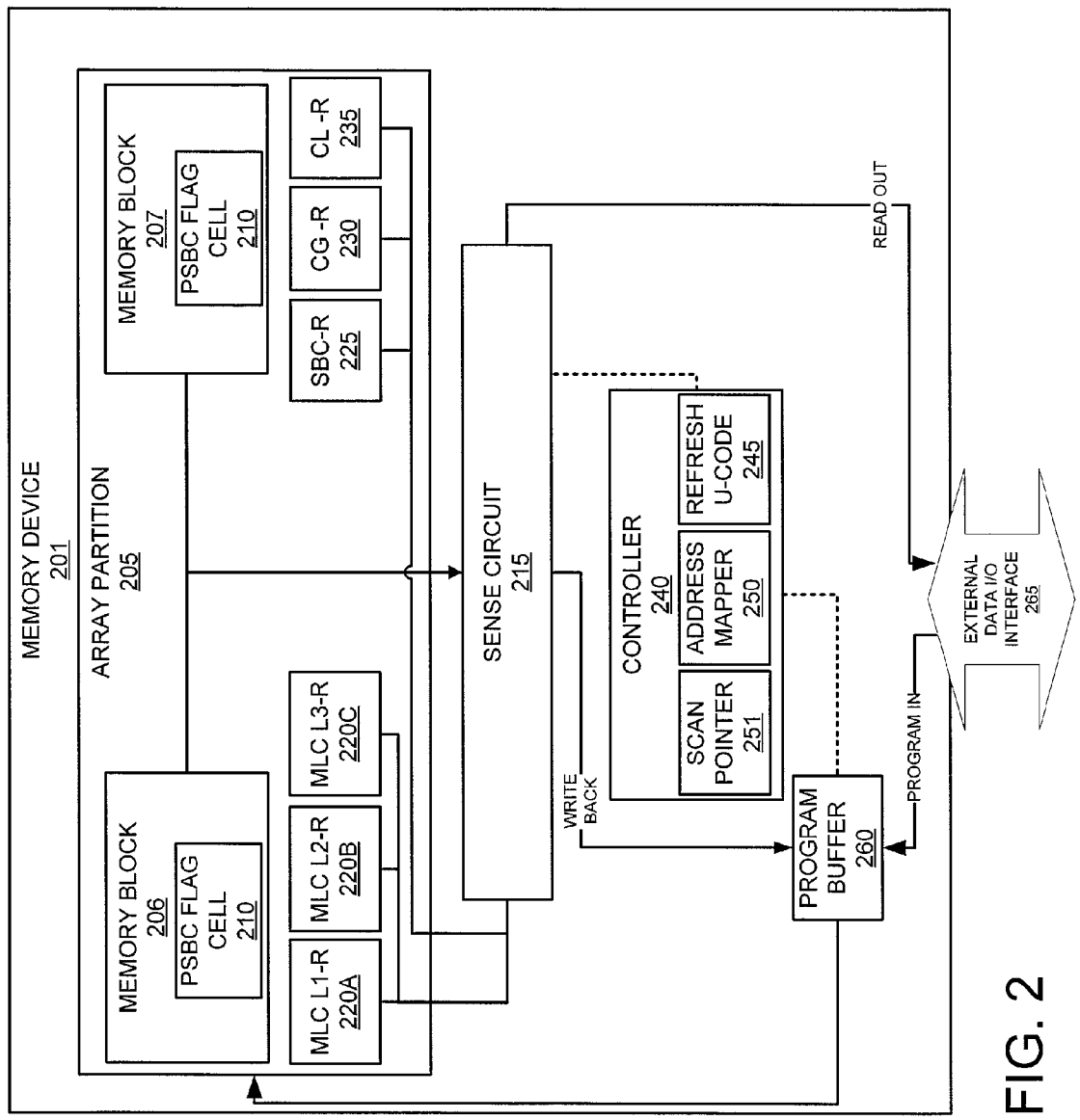
FIG. 2 depicts a block diagram of a memory device configured to selectively refresh memory cells suffering charge gain or loss, in accordance with an embodiment of the present invention.

FIG. 2 depicts an exemplary block diagram of a memory device 201 configured to detect and correct charge gain or loss in a memory cell within array partition 205 that is operable in an SBC mode. As depicted, the array partition 205 includes a plurality of memory cells that may be further arranged into a plurality of memory blocks, illustrated as memory block 206 and memory block 207. In the exemplary embodiment, array partition 205 includes a plurality of non-volatile charge trap memory cells such that memory device 201 is a flash memory device. In other embodiments, other non-volatile memory cell technologies are employed (e.g., phase change, in which case the memory device 201 would include analogous components to detect and correct a resistance gain or loss in a memory cell).

The array partition 205 further includes at least one PSBC flag cell 210 which is programmed to indicate one or more associated memory cells within the array partition 205 or within another partition of the memory device 201 are configured to operate in a (pseudo) SBC mode. PSBC flag cell 210 may be user configurable such that a user of the memory device 201 may specify, based on the state of the PSBC flag cell 210, that an associated memory cell operable in either of both a multiple bit per cell mode and a single bit per cell mode is to be return one bit of data when read out through a sense circuit 215 (SBC mode).

Memory device 201 further includes MLC references 220A, 220B, 220C coupled to the sense circuit 215 enabling the sense circuit 215 to perform an MLC read of a memory cell in multi-bit per cell mode. The number of MLC reference cells utilized is dependent on the number of bits stored when a memory cell is operated in the multi-bit per cell mode. In the exemplary embodiment depicted, three MLC references provide for four levels, or two bit per cell operation. In the illustrated embodiment, MLC references 220A, 220B, 220C are reference cells within the memory array partition 205. However in other embodiments, reference cells may be located anywhere within memory device 201. In still other embodiments, the MLC references 220A, 220B, 220C are provided via a reference circuit which, in place of reference cells, may employ any current or voltage source commonly known in the art.

In addition to the MLC references 220A, 220B, 220C, the memory device 201 includes an SBC reference SBC-R 225 coupled to the sense circuit 215 enabling the sense circuit 215 to perform an SBC read of a memory cell in single-bit per cell mode. As illustrated, the exemplary SBC-R 225 is a reference cell within the memory array partition 205 and provides a reference level distinct from the MLC reference levels. In other embodiments however, the sense circuit 215 may utilize one or more of the MLC references 220A, 220B, 220C to perform an SBC read of a memory cell in single-bit per cell mode.

In an embodiment, refresh references are further included within a memory device to provide reference levels demarking memory refresh states. The refresh references are coupled to the sense circuit 215 such that the multi-level sensing capability of the sense circuit 215 may be utilized for the additional purpose of selective refresh of SBC cells. In the exemplary embodiment, memory device 201 includes a charge gain reference CG-R 230 set to the level as shown in FIG. 1B to demark charge gain (level 1) below the level of the SBC-R 225. The memory device 201 further includes a charge loss reference CL-R 235 set to the level as shown in FIG. 1B to demark charge loss (level 2) with respect to SBC-R 225. The CG-R 230 and CL-R 235 may each be a reference cell within array partition 205, as depicted in FIG. 2. While refresh specific references advantageously provide the greatest degree of freedom with respect to optimizing their value to capture charge/gain and loss, other embodiments which utilize the MLC references themselves to detect states requiring refresh and/or trigger a refresh of a SBC cell may also be implemented.

The memory device 201 further includes a program buffer 260 to receive host data to be written into the array partition 205 as received from an external data I/O interface 265. Host data refers to any data originating external to the memory device 201 and passed through the external data I/O interface 265. In addition to buffering host data, in an embodiment of the invention, the program buffer 260 is coupled to the sense circuit to receive data read out of the array partition 205, thereby providing a "write back" capability. As described elsewhere herein, data write back may be utilized to refresh a cell to a correct state during a scanning of the array partition 205 as part of a memory refresh operation.

As FIG. 2 further illustrates, a controller 240 is coupled to the sense circuit 215 and the program buffer 260. In accordance with embodiments, the controller 240 controls a scanning of the memory cells within memory device 201 for PSBC flag cells as well as scanning of the memory cells associated with a PSBC flag cell denoting SBC operation (i.e., PSBC colonies). The controller 240 may further execute any of the methods described elsewhere herein. For example, the controller may further control the refresh and wear leveling methods performed in the memory device 201 as described elsewhere herein in reference to FIGS. 3-6. In one such embodiment, the controller 240 executes a refresh microcode 245 which causes the controller 240 to perform one or more of the scanning and refresh operations described herein. In a further embodiment, the controller 240 executes both a wear leveling microcode and the refresh microcode 245 which causes the controller 240 to perform either a wear leveling operation if triggered or a refresh operation if not triggered to wear level. The controller 240 is implemented as an application specific ASIC including hardcoded logic equivalent the refresh microcode 245. In particular embodiments, the controller 240 includes or is coupled to an address mapper 250 configured to managing the mapping of logical addresses of host data to physical cell addresses within the array partition 205. In further embodiments, the controller 240 further includes a scan pointer 251, the value of which may be stored within the array partition 205. The scan pointer 251 may be utilized by the controller 240 to demark a memory cell address within the array partition 205 indicative of a physical address where a refresh scan was last interrupted (e.g., by a host data read/write event).

Figure 3:
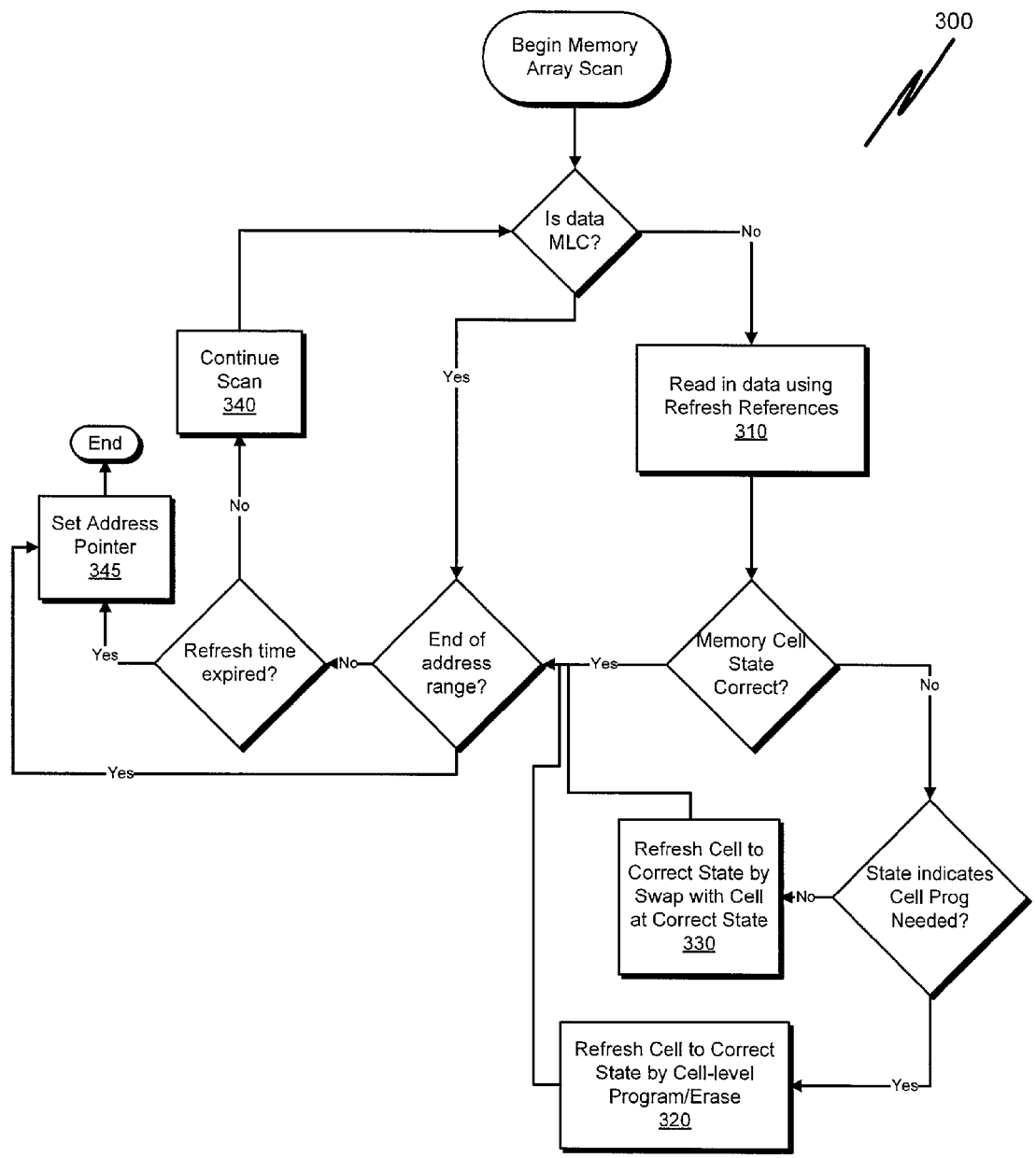
FIG. 3 depicts a flow diagram illustrating particular operations performed by a memory device to detect and correct states in a memory cell, in accordance with an embodiment of the present invention.

FIG. 3 illustrates a flow diagram of a refresh method 300 including operations performed by a memory device, such as the memory device 201, to detect a charge gain or loss in a memory cell. The refresh method 300 may be initiated upon one or more of a number of triggers, depending on the embodiment. For example, in one embodiment, controller 240 may initiate the refresh method 300 at certain time intervals, which may be host/user configurable through a refresh command. Upon the passing of the time interval, the refresh method 300 would then automatically begin with a refresh memory scan. In another embodiment, the refresh method 300 is initiated on power-up of the memory device. In such an embodiment, the refresh method 300 would be executed during the power-up time and because this time is typically desired to be relatively short, triggering the refresh method 300 with a power-up is most practical for memory devices which experience relatively frequent power cycling. In another embodiment, the refresh method 300 begins scanning memory cells upon a memory device entering a standby mode or otherwise entering an idle state. In a particularly advantageous embodiment however, the refresh method 300 is appended to the end of a host data erase algorithm. In such an embodiment, upon completion of the erase (e.g., erase of a memory block 206) the refresh method 300 begins scanning other blocks within the partition (e.g., memory block 207). This refresh scanning can therefore be performed incrementally with each host data erase and the refresh advantageous hidden from a host as part of the erase time. Depending on the erase time specification of the memory device and the actual time required to perform the erase, a larger or smaller population of memory cells is scanned and/or refreshed by the memory device during one refresh time slice.

During the refresh memory scan, flag cells are read to determine if buffered read data is SBC or MLC. If the read buffer contains MLC data, then the scan continues at operation 340 by advancing to the next buffer until the end of an address range or a refresh time allotment is reached. However, if the read buffer contains SBC data, refresh method 300 proceeds to operation 310 and the buffer is read using the refresh reference levels (e.g., SBC-R 225, CG-R 230 and CL-R 235). If no states needing refresh are detected (e.g., cells read are only at level 0 and level 3 as depicted in FIG. 1B), then the buffer passes and if the address range end has not yet been reached and a time allotted for memory cell refresh has not yet expired, the refresh method 300 proceeds by advancing to the next buffer and continues the scan at operation 340. If the refresh time has expired, a scan pointer (e.g., scan pointer 251) is stored at operation 345 to indicate where in the memory array the refresh scan was interrupted so that it may continue at that location upon a subsequent refresh cycle.

If however, a memory cell state is incorrect (e.g., at a level 1 or level 2) refresh method 300 depends upon whether a cell-level program operation will place the cell in the correct state. If the cell requires a program (e.g., level 2 or charge loss) then the refresh method proceeds to the cell program operation 320 and a program algorithm is executed on the failing cell to place it in the correct state. The program algorithm employed may be any conventional in the art. With the cell then at a correct state (e.g., to a correct "programmed" or "set" state), the refresh cycle may either be completed or, in another embodiment, the scan continued at operation 340 if the address range end has not yet been reached and a time allotted for memory cell refresh has not yet expired.

If the cell requires an erase (e.g., level 1 or charge gain) then, if the memory cell is of the type where a single cell may be reprogrammed to an "erased" level, the refresh method also proceeds to the cell program operation 320 to the correct state. For example, in a PCM device, the failing cell would be "reset" to level 0 at the cell program operation 320. For alternative embodiments where an erase cannot be performed at the cell-level, such as in flash memory devices, the refresh method 300 proceeds to the swap operation 330. To correct the level 1 state at the swap operation 330, a block swap is queued to swap all cells in a failing block (containing the failing cell) with a refreshed bock containing cells that have been erased/programmed to have the states of the failing block with the exception that the failing cell determined to be at level 1 within the failing block will be at level 0 in the refresh block. With the cell then at a corrected state (e.g., a correct "erased" state), the refresh cycle is either ended as complete, or in another embodiment, the scan continued at operation 320 if the address range end has not yet been reached and a time allotted for memory cell refresh has not yet expired.

Figure 4:
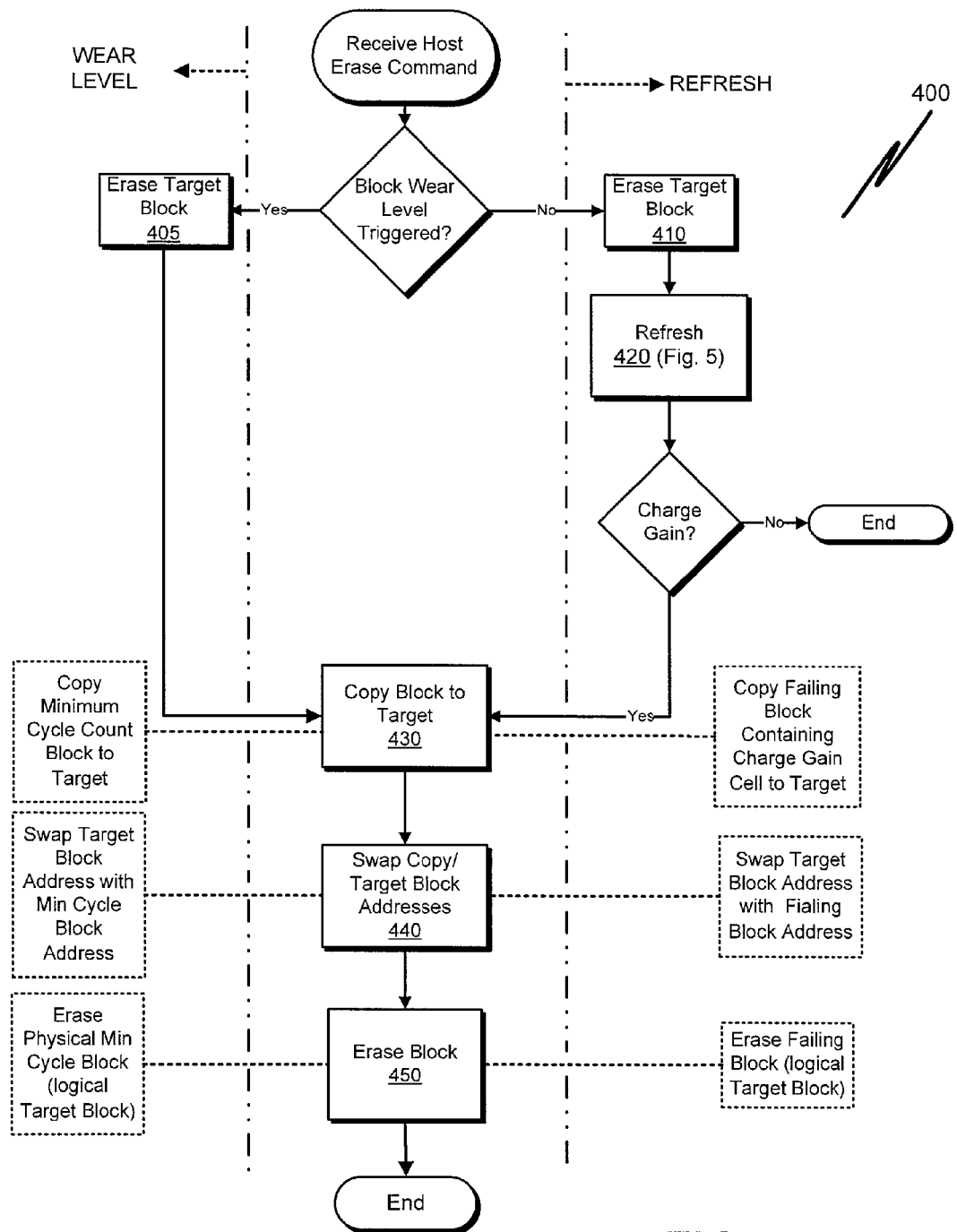
FIG. 4 depicts a flow diagram illustrating particular operations performed by a memory device to integrate refresh with wear leveling, in accordance with an embodiment of the present invention.

FIG. 4 depicts a flow diagram illustrating a refresh integration method 400 integrating a refresh method with a wear leveling method, in accordance with an embodiment. Such an embodiment illustrates how a memory device which performs wear leveling may be adapted to further perform refresh. The refresh integration method 400 takes advantage of the potential need to swap blocks for the purpose of either wear leveling or refresh and has further synergy when both the refresh and wear leveling operations are appended to a host data erase algorithm. In FIG. 4, operations common to both a refresh method and a wear leveling method are positioned down the center of the flow diagram while operations or conditions specific to wear leveling are on the "wear leveling erase" side of the flow diagram. Similarly, operations or conditions specific to refresh are on the "refresh erase" side of the flow diagram.

The refresh integration method 400 begins with a flash memory device receiving a host erase command. The memory device (e.g., memory device 201, or more specifically controller 240) determines if a block wear leveling algorithm trigger has been satisfied. Any conventional block wear leveling trigger may be utilized. As one wear leveling algorithm example, the block to be erased in response to the host erase command (i.e., "target block") may be tested against a block erase cycle count threshold. If wear leveling is triggered, then the wear leveling algorithm is executed at operation 405 to erase the target block. The wear leveling method then proceeds to operation 430 where, for example, a minimum cycle count block is copied to the target block in an effort to reduce the subsequent erase frequency of the target block. At the address swap operation 440, the logical address of the target block is swapped with that of the minimum cycle block address to maintain a means of accessing the data copied into the target block. Then at the erase operation 450, the minimum cycle block is erased to free up the quantity of memory expected in response to the received host erase command and the refresh method 400 ends, completing the wear leveling cycle.

As further depicted in FIG. 4, if wear leveling is not triggered, then the time not utilized for the purposes of wear leveling is used by the memory device/controller to for the purposes of refresh. The refresh method is entered and at operation 410 where the target block is erased to satisfy the received host erase command. The refresh then proceeds to execute the refresh 420, which is further illustrated in an expanded flow diagram in FIG. 5 and described in detail elsewhere herein. If the refresh 420 returns with no cells requiring a block swap (e.g., no charge gain) then either no refresh states were detected and no refresh was required or the refresh 420 handled any cell refresh through a programming operation. In either case, the refresh integration method 400 then ends, completing a refresh cycle.

Where the refresh 420 returns with a charge gain cell, the refresh integration method 400 proceeds to the block copy operation 430 and copies the failing block containing a charge gain cell to the target block (which was just erased at operation 410) to refresh the cell to the correct state. The refresh method then proceeds to the swap operation 440 where the failing block address is swapped with the target block address to maintain accessibility of the refreshed data. Then at the erase operation 450, the failing block is erased to free up the quantity of memory expected in response to the received host erase command and the refresh integration method 400 ends, completing a refresh cycle.

Figure 5:
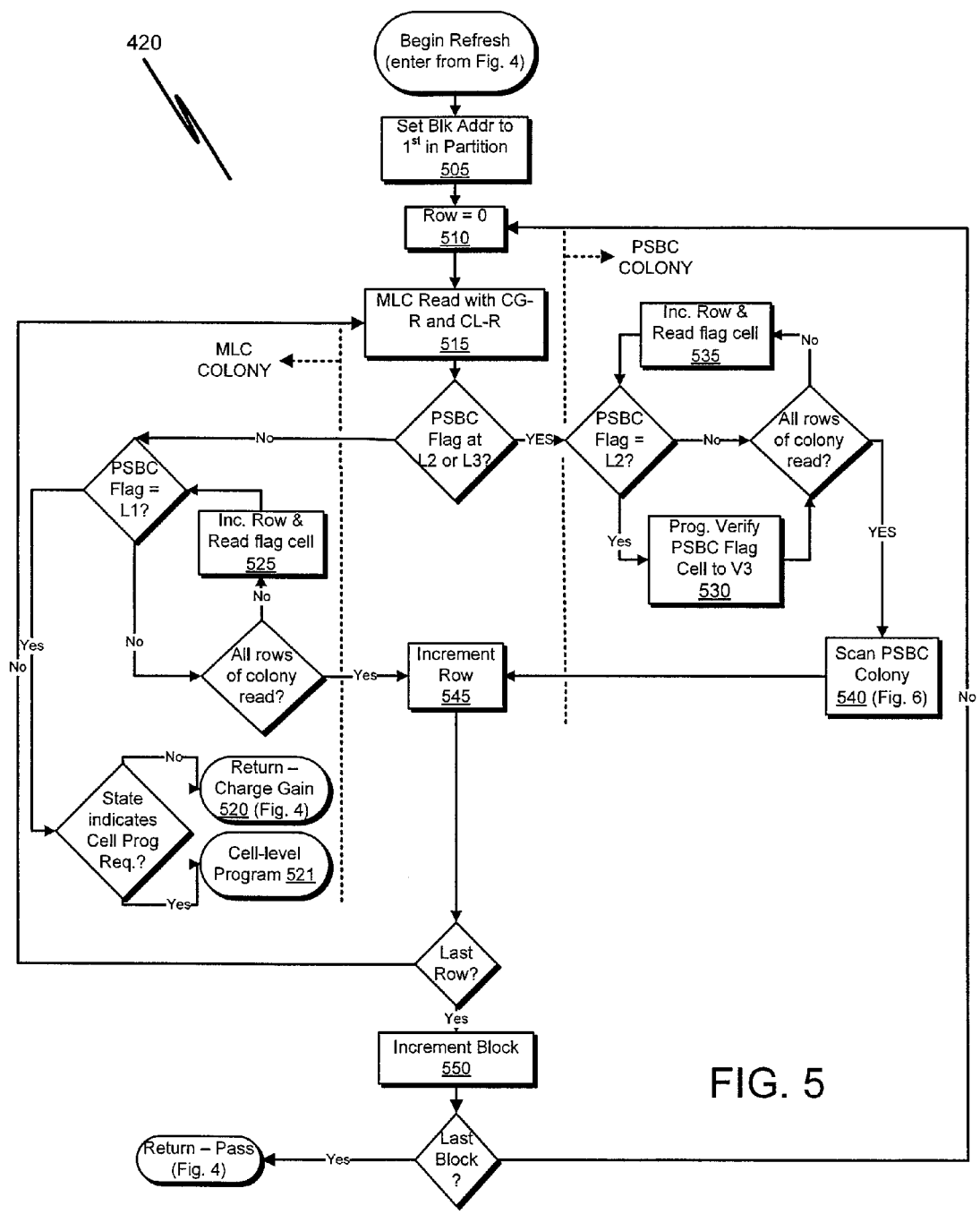
FIG. 5 depicts a flow diagram illustrating an expanded view of the refresh operation depicted in FIG. 4, in accordance with an embodiment of the present invention.

FIG. 5 depicts a flow diagram illustrating an expanded view of the refresh 420 denoted in FIG. 4, in accordance with an embodiment. It should be noted however, that the refresh 420 does not require the integration with wear leveling depicted in FIG. 4. Generally, the refresh 420 performs a scan of the memory using a read of minimum granularity that can be performed to find a PSBC flag cell bit set to the SBC state. PSBC flag cell states are checked to determine if they require refresh (e.g., potentially incorrectly demarking an MLC or SBC colony). In PSBC colonies, every cell in the row(s) comprising the colony is read for the purposes of identifying memory states requiring refresh while MLC colonies themselves are bypassed.

The refresh 420 enters from the refresh integration method 400 of FIG. 4 and at operation 505, the block address is set to the first block in the partition (e.g., memory block 206 of FIG. 2). At operation 510, the scan is further set to row 0 within the first block. At operation 515 the PSBC flag cell is MLC read using a sense circuit (e.g., sense circuit 215) and the CG-R 230 and CG-R 235 references. If the PSBC flag cell is not at level 2 or level 3 depicted in FIG. 1B, then the associated memory cells are determined to be operating in MLC mode (an MLC colony). If the PSBC flag cell is at level 1, then it is determined whether a cell-level reprogramming of the cell can be accomplished (e.g., for a bit alterable memory technology such as PCM, etc.). If so, the flag cell itself is reprogrammed to the correct state at operation 521. If the flag cell itself cannot be reprogrammed, it is identified to be in a charge gain state and refresh 420 handles the flag cell charge gain at operation 520 with the swap block operation 320 of FIG. 3, or as more particularly illustrated in operations 430-450 in FIG. 4. Otherwise, the PSBC flag cell is in the proper state to denote an MLC colony and the refresh 420 proceeds to operation 525 to MLC read with the CG-R and CL-R references another row of the MLC colony. That loop is then continued until the other PSBC flag cells of that MLC colony are read.

If however, the PSBC flag cell is at either level 2 or level 3 depicted in FIG. 1B, then the associated memory cells are determined to be operating in SBC mode (a PSBC colony). If the PSBC flag cell is at level 2, then the flag cell itself is in a charge loss state and refresh 420 handles the flag cell charge loss at operation 530 via a cell program operation. For example, a conventional program verify algorithm may be employed to program up the PSBC flag cell to level 3 (i.e., correct PSBC flag state). Otherwise, if the PSBC flag cell not at level 2 and is instead already at level 3, then the flag cell in the proper state to denote an PSBC colony and the refresh 420 proceeds to operation 535 to MLC read with the CG-R and CL-R references another row of the PSBC colony. This loop is then continued until the other PSBC flag cells of that PSBC colony are read.

With the PSBC flag cells of the PSBC colony in the correct level 3 state, the refresh 420 proceeds to scan every memory cell within the PSBC colony with the colony scan 540 for the purpose of detecting an SBC memory cell which needs a refresh to place it in a correct state. The colony scan 540 is described in further detail elsewhere herein with reference to FIG. 6

Upon scanning a given MLC or PSBC colony, the refresh 420 proceeds to operation 545 and the array row is incremented to move beyond the previously scanned colony and identify if the subsequent row's PSBC flag cell denotes an MLC or PSBC colony. Once the last row of a memory block is reached, the block is incremented (e.g., scan moves from memory block 206 to memory block 207) at operation 550 and the refresh 420 proceeds back to operation 510 where the scan of that next block is started at the first row. Upon reaching the last block, refresh 420 completes with a return, for example, back to the refresh method 400 depicted in FIG. 4 (where the refresh integration method 400 will subsequently end because there are no charge gain cells).

Figure 6:
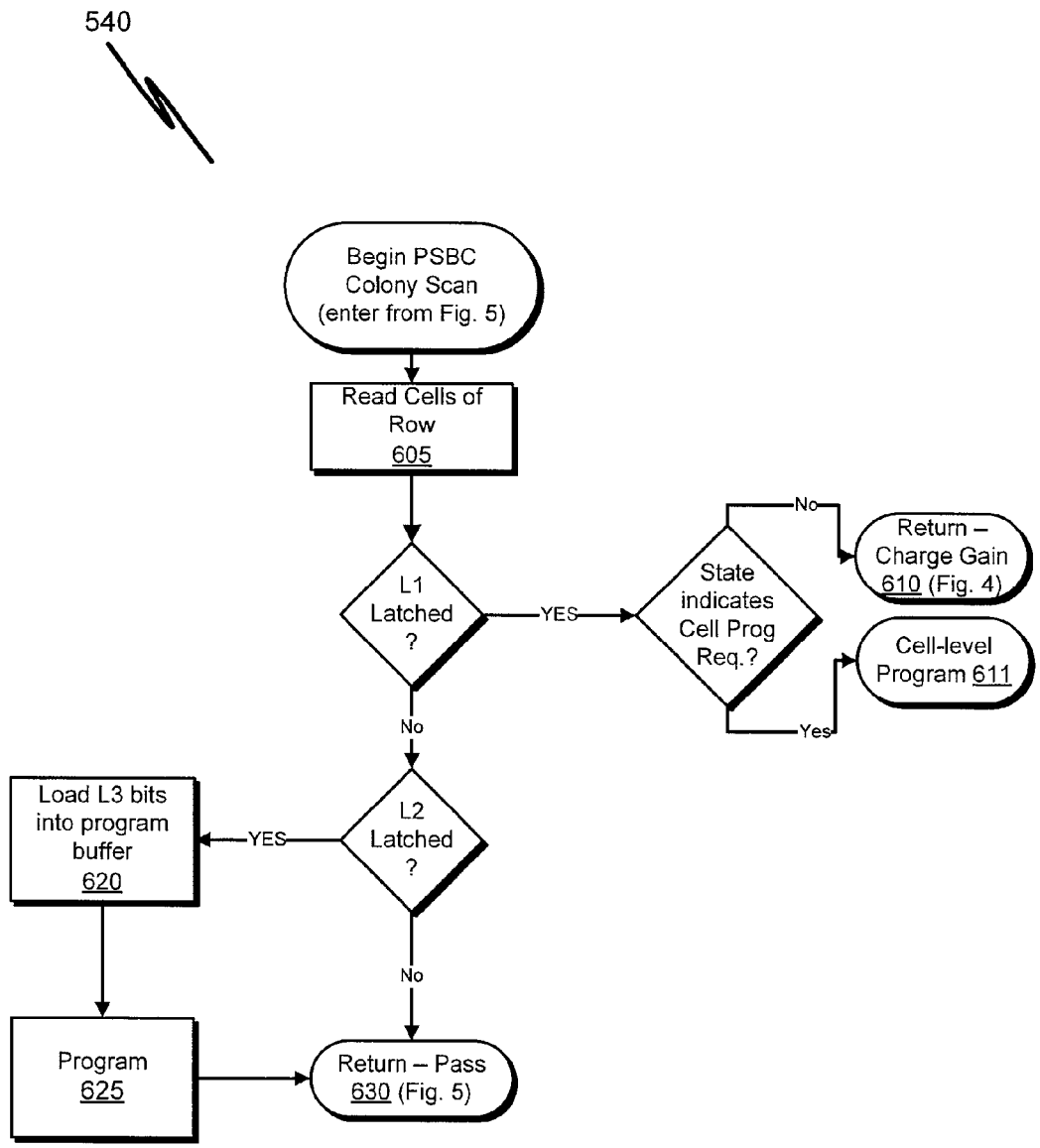
FIG. 6 depicts a flow diagram illustrating an expanded view of the SBC colony scan operation depicted in FIG. 5, in accordance with an embodiment of the present invention.

FIG. 6 depicts a flow diagram illustrating an expanded view of the colony scan 540 denoted in FIG. 5, in accordance with an embodiment. As shown, at operation 605, an array read is performed which in one embodiment comprises a read and write back to a program buffer (e.g., program buffer 260). As the array read is performed with the sense voltage at the CG-R reference level, if a row latches at level 1, then the colony scan 540 either performs a cell-level reprogramming at operation 611 (e.g., for bit alterable memories such as PCM, etc.) or returns with a charge gain cell at operation 610. The charge gain cell may then, for example, be refreshed as further illustrated in FIG. 4. If there is no level 1 latched, then the sense voltage is incremented up to the CL-R reference 235 to detect charge loss. If a row latches at level 2, then the colony scan 540 proceeds to operation 620 to refresh any cell at level 2. In one embodiment, any cell with a level 2 value has a level 3 value loaded in the program buffer. At operation 625, the program buffer is loaded into the memory array, reprogramming any of the level 2 cells identified by the refresh method. The colony scan 540 then completes with a return to the refresh 420 in FIG. 5.

Figure 7:
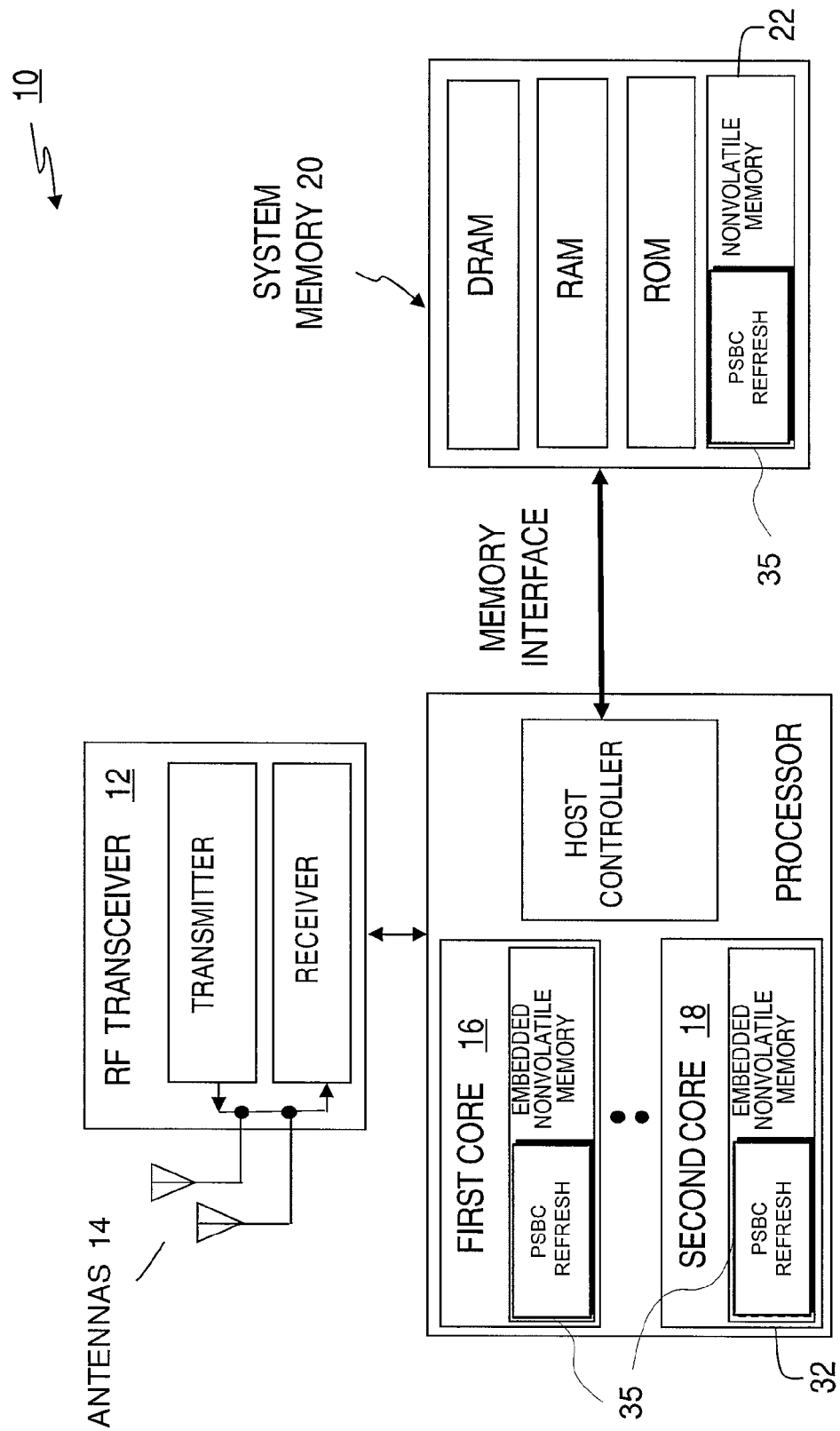
FIG. 7 illustrates a wireless architecture that incorporates memory array which may be included in a memory device configured to refresh in a manner which detects and repairs memory cell failures, in accordance with an embodiment of the present invention.

The wireless architecture embodiment illustrated in FIG. 7 shows a communications device 10 that includes non-volatile memory with content rotation capabilities in accordance with embodiments of the present invention. It should be noted that the present invention is not limited to wireless communication embodiments and other, non-wireless applications may use the present invention. As shown in this wireless embodiment, a communications device 10 includes one or more antenna structures 14 to allow radios to communicate with other over-the-air communication devices. As such, communications device 10 may operate as a cellular device or a device that operates in wireless networks such as, but not limited to, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks.

The depicted embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor having one or more processor cores 16 and 18. The multiple cores allow processing workloads to be shared across the cores and handle baseband functions and application functions. An interface may be used to provide communication or information between the processor and the memory storage in a system memory 20. The interface may comprise, for example, serial and/or parallel buses to share information along with control signal lines to be used to provide handshaking between the processor and system memory 20.

The system memory 20 may optionally be used to store instructions that are executed by the processor during the operation of wireless communication device 10, and may be used to store user data such as the conditions for when a message is to be transmitted by wireless communication device 10 or the actual data to be transmitted. For example, the instructions stored in system memory 20 may be used to perform wireless communications, provide security functionality for communication device 10, user functionality such as calendaring, email, internet browsing, etc.

Figure 8:
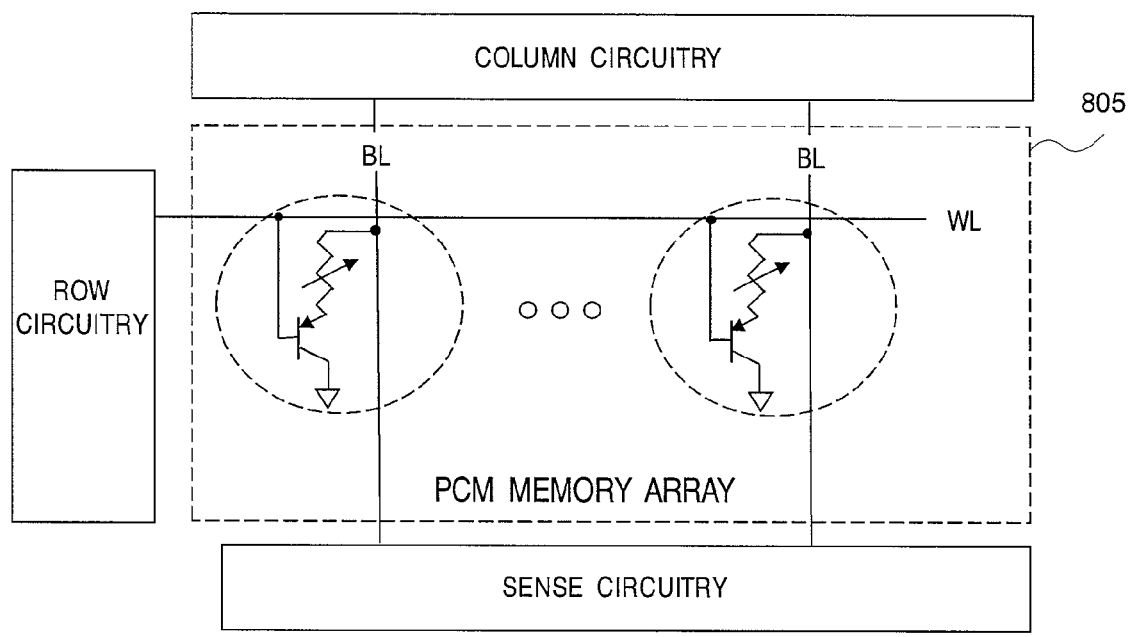
FIG. 8 is a schematic representation of a phase change memory (PCM) array which may be included in a memory device configured to refresh in a manner which detects and repairs memory cell failures, in accordance with an alternative embodiment.
Figure 9:
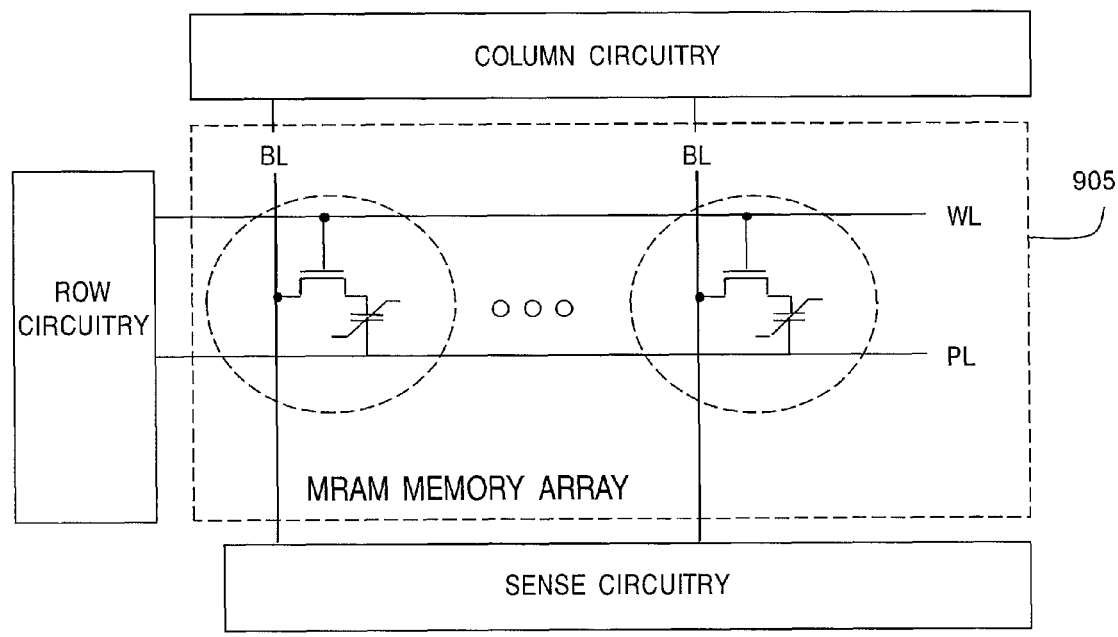
FIG. 9 is a schematic representation of an magnetic random access memory (MRAM) array which may be included in a memory device configured to refresh in a manner which detects and repairs memory cell failures, in accordance with an alternative embodiment.
Figure 10:
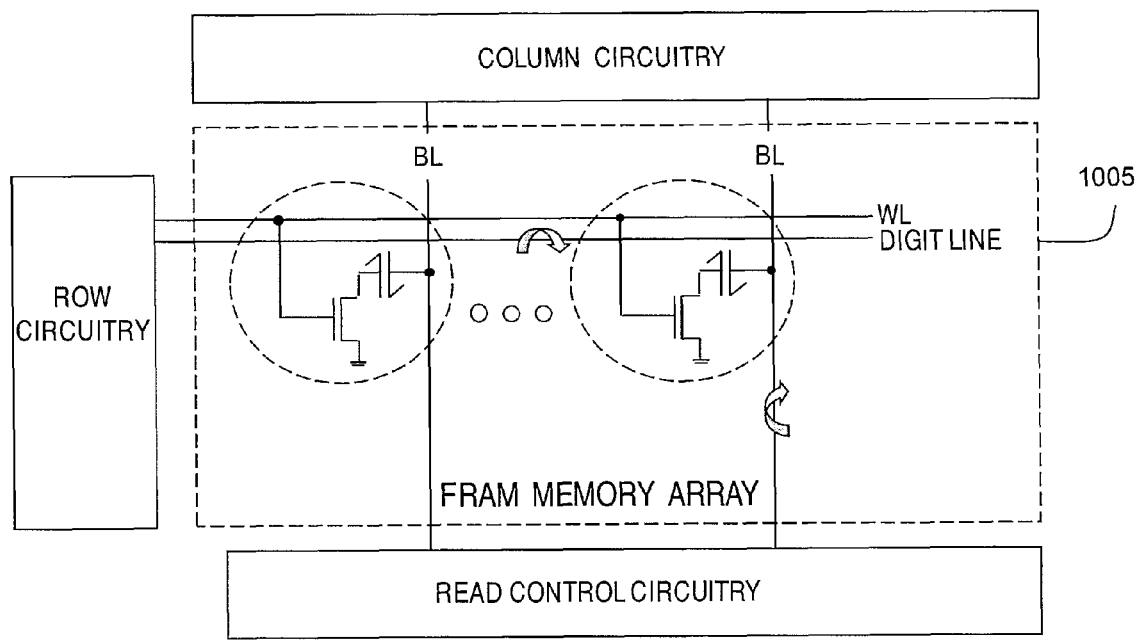
FIG. 10 is a schematic representation of a ferroelectric RAM (FRAM) array which may be included in a memory device configured to refresh in a manner which detects and repairs memory cell failures, in accordance with an alternative embodiment.
Figure 11:
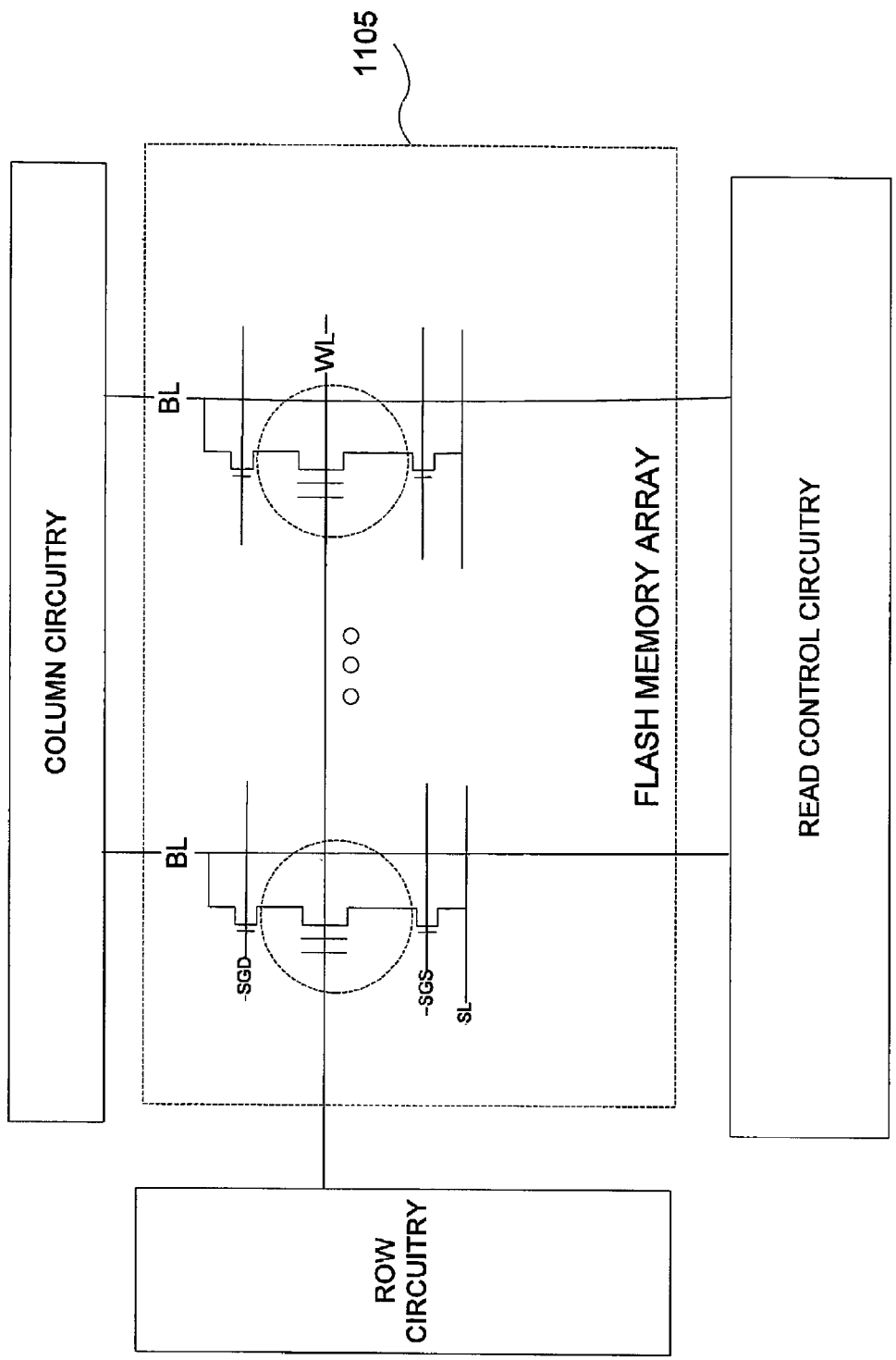
FIG. 11 is a schematic representation of a flash array which may be included in a memory device configured to refresh in a manner which detects and repairs memory cell failures, in accordance with an alternative embodiment.

System memory 20 may be provided by one or more different types of memory and may include both volatile and a non-volatile memory 22. Non-volatile memory may non-volatile memory types, such as, but not limited to PCM (e.g., as depicted in FIG. 8), Phase-Change Random Access Memory (PRAM or PCRAM), Ovonic Unified Memory (OUM), Chalcogenide Random Access Memory (C-RAM), MRAM (e.g., as depicted in FIG. 9) or FRAM (e.g., as depicted in FIG. 10) in addition to the exemplary flash memory embodiment (e.g., as depicted in FIG. 11). The embodiment depicted in FIG. 7 also illustrates that one or more of the processor cores may be embedded with non-volatile memory 32. Any of these non-volatile memories may include subsystems 35 configured to refresh in a manner which detects and repairs memory cell failures, as further described elsewhere herein.

FIG. 8 shows a PCM array 805. In such an embodiment, the PCM array 805 serves as the memory array partition 205 depicted in FIG. 2 to implement SBC refresh in a multi-level PCM device. Each PCM cell includes alloys of elements of group VI of the periodic table, such as Te or Se, that are referred to as chalcogenides or chalcogenic materials. Chalcogenides may be used advantageously in phase change memory cells to provide data retention and remain stable even after the power is removed from the non-volatile memory. Taking the phase change material as $Ge_2Sb_2Te_5$ for example, two phases or more are exhibited having distinct electrical characteristics useful for memory storage.

PCM array 805 includes memory cells each having a selector device and a memory element. Although the array is illustrated with bipolar selector devices, alternative embodiments may use CMOS selector devices or diodes. By using any method or mechanism known in the art, the chalcogenic material may be electrically switched between different states intermediate between the amorphous and the crystalline states, thereby giving rise to a multilevel storing capability. The cells of PCM array 805 may therefore be operable in either single-bit per cell mode or multiple-bit per cell mode.

To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material. By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "1" value.

On the other hand, to program a memory cell from reset to set, the local temperature is raised higher than the crystallization temperature (Tx) for a relatively longer time to allow crystallization to complete. Thus, the cell can be programmed by setting the amplitude and pulse width of the current that will be allowed through the cell.

In a read operation, the bit line (BL) and word line (WL) are selected and an external current is provided to the selected memory cell. To read a chalcogenide memory device, the current difference resulting from the different device resistance is sensed.

FIG. 9 shows a MRAM array 905 where magnetic storage elements are formed from two ferromagnetic plates located at an intersection of a row and column line and selected by a Magnetic Tunnel Junction (MTJ) device. In such an embodiment, the MRAM array 715 serves as the memory array partition 205 depicted in FIG. 2 to implement SBC refresh in a multi-level MRAM device. For such an embodiment, current imparted to the row line in one direction causes a magnetic field operative on the MRAM cell biasing the MRAM cell toward a particular state. Due to a magnetic tunnel effect, the electrical resistance of the memory cell changes based on the orientation of the fields in the two plates. The cells of MRAM array 905 may be operable in either single-bit per cell mode or multiple-bit per cell mode where any method or mechanism known in the art may be employed to provide multiple-bit per cell storage.

Data may be written to the memory cells using a variety of means. In the simplest, each cell lies between a pair of write lines arranged at right angles to each other, above and below the cell. When current is passed through them, an induced magnetic field is created at the junction, which the writable plate picks up. Other approaches known in the art, such as the toggle mode, spin-torque-transfer (STT) or Spin Transfer Switching, spin-aligned ("polarized") may be used to directly torque the domains.

Reading data stored in a memory cell is accomplished by measuring the electrical resistance of the cell. A particular cell is selected by powering an associated transistor which switches current from a supply line through the cell to ground. Due to the magnetic tunnel effect, the electrical resistance of the cell changes due to the orientation of the fields in the two plates. By measuring the resulting current, the resistance inside the selected cell is determined, and from this the polarity of the writable plate.

FIG. 10 shows a FRAM array 1005 where memory cells may be a one transistor cell, or alternatively, the transistor-capacitor cell that is illustrated in the figure. In such an embodiment, the FRAM array 1005 serves as the memory array partition 205 depicted in FIG. 2 to implement SBC refresh in a multi-level FRAM device. In such an embodiment, the capacitor includes the ferroelectric material and an atom in the ferroelectric material is shifted to form a plurality of stable polarization states. Memory cell data may be written by orienting the dipoles of the ferroelectric material via an applied polarizing voltage. Data may be read by detecting the voltage of the bit line (BL) connected with the memory cell. An orientation is stable and remains in place even after the electric field is removed, preserving the data within the memory. In an embodiment, the cells of FRAM array 1005 are operable in either single-bit per cell mode or multiple-bit per cell mode where any method or mechanism known in the art may be employed to provide multiple-bit per cell storage capability.

FIG. 11 shows a NAND flash memory array 1105. In such an embodiment, the NAND flash memory array 1105 serves as the memory array partition 205 depicted in FIG. 2 to implement SBC refresh in a NAND flash device. A cell may be coupled to a source line SL a bit line BL via select transistors. Select lines SGS and SGD may be used to control select transistors. Memory device 1105 includes word lines WL to access memory cells. Each of bit lines BL may be a physical conductor to carry information in form of charge during the program, read, or erase operation of memory device 1105. To program, read, or erase memory cells, appropriate voltages may be applied to select lines SGS and SGD, source line SL, word lines WL, and bit lines BL, as known in the art. In a similar fashion, a NOR flash memory array (not depicted) may also be utilized to implement SBC refresh in a NOR flash device.

Thus, systems and methods of selective memory refresh to detect and repair SBC failures have been disclosed. Although embodiments of the present invention have been described in language specific to structural features or methodological acts, it is to be understood that the invention defined in the appended claims is not necessarily limited to the specific features or embodiments described.

What is claimed is:

1. A method of refreshing cells of a non-volatile memory device, the method comprising:
   determining a memory cell operable in either of both a multi-bit per cell mode and a single-bit per cell mode to be in the single-bit per cell mode;
   comparing a sensed state of the memory cell to a plurality of reference cell states; and
   reprogramming the memory cell or swapping the memory cell for another cell that is in a correct state, based on the sensed memory state.

2. The method as in claim 1, wherein determining the memory cell to be in a single-bit per cell mode further comprises scanning a memory array and determining a flag cell associated with the memory cell to be in single-bit per cell state.

3. The method as in claim 1, wherein the non-volatile memory device is a flash memory device;
   wherein comparing the sensed memory cell state comprises sensing a threshold voltage level of the memory cell with a sensing circuit;
   wherein the plurality of reference cell states comprises a charge gain reference level, a single-bit per cell specific reference level above the charge gain reference level, and a charge loss reference level above the single-bit per cell specific reference voltage level; and
   wherein comparing a sensed state of the memory cell to a plurality of reference cell states further comprises determining the threshold voltage level of the memory cell is between the charge gain reference level and the charge loss reference level.

4. The method as in claim 3, wherein determining the memory cell to be in a single-bit mode state further comprises:
   sensing a flag cell level with the sensing circuit;
   comparing the sensed flag cell level to the plurality of reference cell levels; and
   reprogramming the flag cell level or swapping the flag cell for another flag cell at a correct level, based on the sensed flag level.

5. The method as in claim 3, wherein the sensing circuit is the same circuit employed for sensing the memory cell when operated in a multi-bit per cell mode; and
   wherein at least one of the charge gain reference level and the charge loss reference level is different than any of the reference levels utilized by the sensing circuit to read the memory cell when in multi-bit per cell mode.

6. The method as in claim 3, wherein comparing a sensed state of the memory cell to the plurality of reference cell states comprises determining that the memory cell level is between the single-bit per cell specific reference level and the charge gain reference level; and
   wherein reprogramming the memory cell or swapping the memory cell comprises reprogramming the memory cell to a level greater than the charge loss reference level.

7. The method as in claim 3, wherein comparing a sensed state of the memory cell to the plurality of reference cell states comprises determining that the memory cell level is between the single-bit per cell specific reference level and the charge loss reference level; and
   wherein reprogramming the memory cell or swapping the memory cell comprises swapping the cell for another by:
   erasing a first block of memory cells not containing the memory cell;
   copying the contents of a second block of memory cells containing the memory cell into the erased first block; and
   remapping a logical address associated with the first block to the second block.

8. The method as in claim 4, wherein comparing the sensed flag cell level to the plurality of reference cell levels comprises determining the level of the flag cell is between the single-bit per cell specific reference level and the charge loss reference level; and
   wherein reprogramming the flag cell level or swapping the flag cell for another flag cell at the correct level comprises reprogramming the flag cell to a level greater than charge loss reference level.

9. The method as in claim 4, wherein comparing the sensed flag cell level to the plurality of reference cell levels comprises determining the level of the flag cell is between the single-bit per cell specific reference level and the charge gain reference level; and
   wherein reprogramming the flag cell level or swapping the flag cell for another flag cell at the correct state comprises swapping the flag cell for another by:
   erasing a first block of memory cells not containing the flag cell;
   copying the contents of a second block of memory cells containing the flag cell into the erased first block; and
   remapping a logical address associated with the first block to the second block.

10. The method as in claim 1, wherein the comparing of the sensed memory cell state to a plurality of reference cell states is executed as part of an erase operation performed in response to receiving an external erase command through a memory device interface.

11. A non-volatile memory device, comprising:
    an array of memory cells, each memory cell operable in either of both a multi-bit per cell mode and a single-bit per cell mode as determined by the state of an associated flag cell;
    a plurality of single bit per cell state references;
    a memory controller coupled to a sensing circuit and coupled to a program buffer, wherein the memory controller is configured to scan the memory cells with the sensing circuit to detect flag cells having a state indicative of the single-bit per cell mode, the memory controller further configured to refresh a memory cell associated with the detected flag cell based on a comparison of the memory cell state to the plurality of single bit per cell state references.

12. The non-volatile memory device as in claim 11, wherein the plurality of single bit per cell state references comprise a first reference cell set to a charge gain reference level, a second reference cell set to a single-bit per cell specific reference level above the charge gain reference level, and a third reference level set to a charge loss reference level above the single-bit per cell specific reference voltage level.

13. The non-volatile memory device as in claim 12, wherein the first, second and third reference cells are distinct from reference cells utilized by the sensing circuit to read a memory cell operating in the multiple bit per cell mode.

14. The non-volatile memory device as in claim 12, wherein the memory controller is further configured to refresh the memory cell by loading the program buffer with a voltage level above the third reference level for the memory cell in response to the sense circuitry sensing the memory cell is at a threshold voltage level between the second and the third reference levels.

15. The non-volatile memory device of claim 12, wherein the memory controller is further configured to refresh the memory cell by mapping a logical address associated with a block of the memory array containing the memory cell to a physical address of a block programmed to have an erased cell corresponding to an address of the memory cell.

16. The non-volatile memory device of claim 11, wherein the controller is configured to execute a wear leveling operation in response to a triggering event; and
   wherein the controller is configured to perform the scan in absence of the triggering event.

17. The non-volatile memory device of claim 11, wherein the array of memory cells comprises at least one of a plurality flash memory cells or a plurality of phase change memory (PCM) cells.

18. A wireless communication device, comprising:
   a transceiver to receive over-the-air signals;
   a processor core coupled to the transceiver; and
   a non-volatile memory embedded with the first processor core, the non-volatile memory including an array of memory cells to store data operated on by the processor, each memory cell of the array operable in either of both a multi-bit per cell mode and a single-bit per cell mode, and the non-volatile memory configured to scan the contents of memory cells in the array to determine, based on a comparison of the memory cell state to a plurality of single bit per cell state references, if a memory cell in the single-bit per cell mode is to be refresh.

19. The wireless communication device as in claim 18, wherein the memory controller is configured iteratively perform a portion of the scan as part of an erase instruction originating from the processor core and wherein the memory controller maintains an address pointer indicative of a physical address where the scan was last interrupted.

20. The wireless communication device as in claim 18, wherein the non-volatile memory comprises at least one of a plurality flash memory cells or a plurality of phase change memory (PCM) cells.

* * * * *

UNITED STATES PATENT AND TRADEMARK OFFICE
CERTIFICATE OF CORRECTION

| | | |
|---|---|---|
| PATENT NO. | : 7,936,610 B1 | Page 1 of 1 |
| APPLICATION NO. | : 12/534792 | |
| DATED | : May 3, 2011 | |
| INVENTOR(S) | : Robert Melcher et al. | |

It is certified that error appears in the above-identified patent and that said Letters Patent is hereby corrected as shown below:

In column 15, line 14, in Claim 17, after "plurality" insert -- of --.

In column 16, line 11, in Claim 19, after "configured" insert -- to --.

In column 16, line 18, in Claim 20, before "flash" insert -- of --.

Signed and Sealed this
Twenty-eighth Day of June, 2011

David J. Kappos
*Director of the United States Patent and Trademark Office*